United States Patent [19]
Aipperspach et al.

[11] Patent Number: 4,849,904
[45] Date of Patent: Jul. 18, 1989

[54] MACRO STRUCTURAL ARRANGEMENT AND METHOD FOR GENERATING MACROS FOR VLSI SEMICONDUCTOR CIRCUIT DEVICES

[75] Inventors: Anthony G. Aipperspach; Douglas M. Dewanz, both of Rochester, Minn.; Joseph M. Fitzgerald, Austin, Tex.

[73] Assignee: International Business Machines Corporation, Armonk, N.Y.

[21] Appl. No.: 64,030

[22] Filed: Jun. 19, 1987

[51] Int. Cl.⁴ .............................................. G06F 15/60
[52] U.S. Cl. ..................................... 364/489; 364/488
[58] Field of Search ............... 364/480, 488, 489, 490, 364/491; 365/189

[56] References Cited

U.S. PATENT DOCUMENTS

| | | | |
|---|---|---|---|
| 4,596,003 | 6/1986 | Shimizu | 365/189 |
| 4,598,386 | 7/1986 | Roesner et al. | 365/189 |
| 4,602,339 | 7/1986 | Aihara etr al. | 364/491 |
| 4,694,433 | 9/1987 | Wiedmann | 365/230 |
| 4,724,531 | 2/1988 | Angleton et al. | 364/490 |

Primary Examiner—Bruce Y. Arnold
Assistant Examiner—Terry S. Callaghan
Attorney, Agent, or Firm—Mason, Kolehmainen, Rathburn & Wyss

[57] ABSTRACT

A macro generation method and a macro structural arrangement are provided for a VLSI semiconductor circuit device. A circuit macro is defined by a plurality of circuit blocks including at least one control block and an identified number of storage blocks. The control block includes a control section, a bit decoder section, a word decoder section and a work selector section. Each of the storage blocks includes a memory section, a bit selector section and a sense latch driver section. One of a plurality of stored predetermined bit decoders is selectively provided for the bit decoder section. A required number of storage blocks is identified responsive to the selected bit decoder for the selected number of bits per word. A required number of word selectors and memory array subsections is identified responsive to the selected bit decoder for the selected number of words.

26 Claims, 13 Drawing Sheets

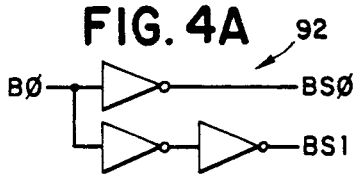
FIG. 4A 92
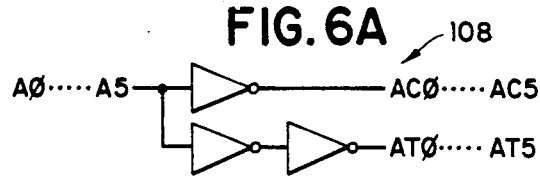
FIG. 6A 108
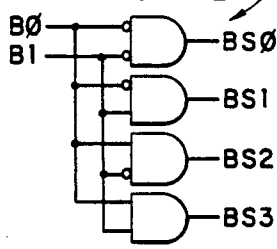
FIG. 4B 94
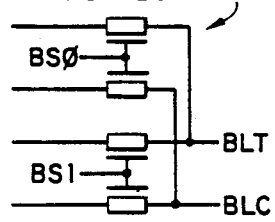
FIG. 5A 100
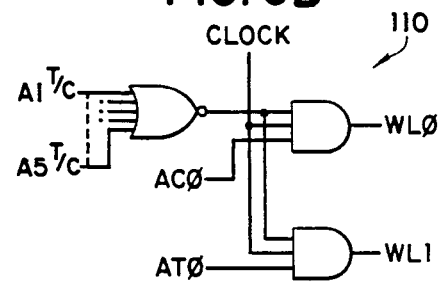
FIG. 6B 110
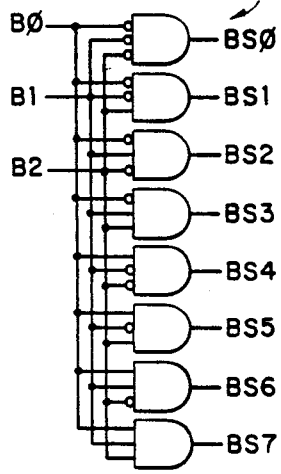
FIG. 4C 96
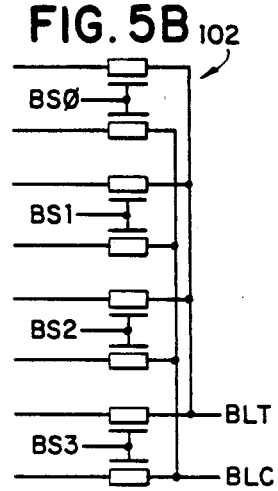
FIG. 5B 102
FIG. 5D
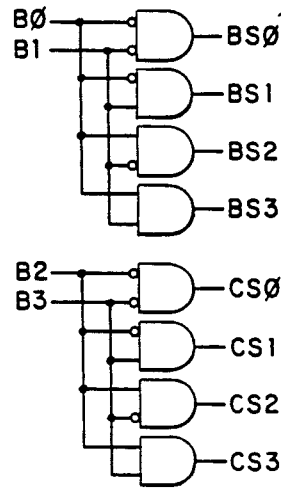
FIG. 4D 98
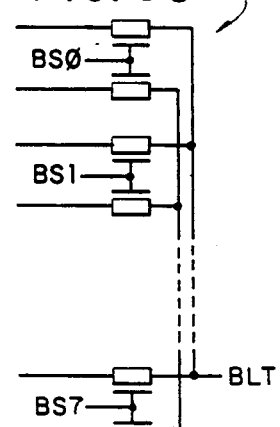
FIG. 5C 104
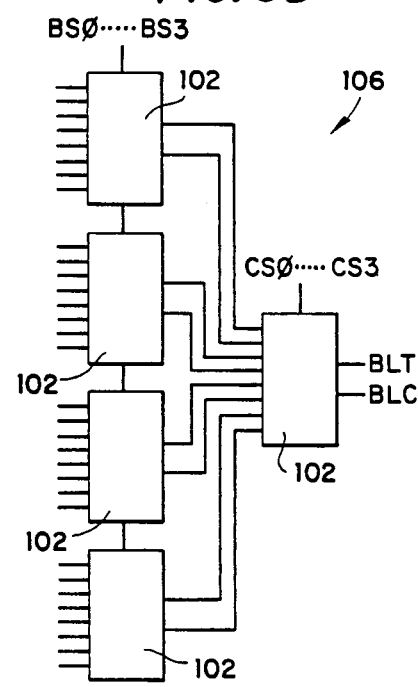

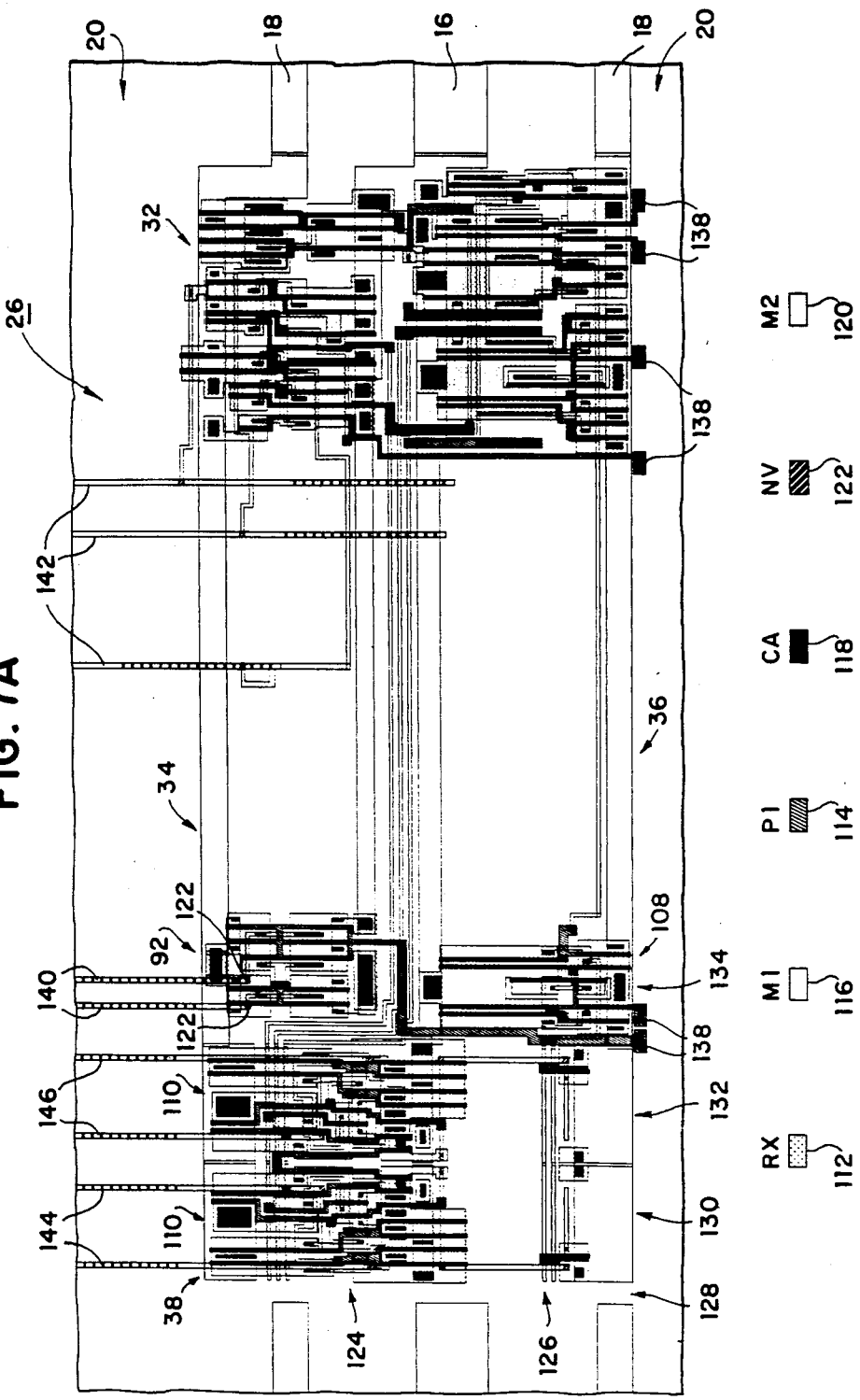

MACRO STRUCTURAL ARRANGEMENT AND METHOD FOR GENERATING MACROS FOR VLSI SEMICONDUCTOR CIRCUIT DEVICES

BACKGROUND OF THE INVENTION

The present invention relates to Very Large Scale Integrated (VLSI) semiconductor circuit devices and particularly to a macro structural arrangement and method for generating macros for VLSI semiconductor integrated circuits.

VLSI semiconductor circuit devices typically define complex systems including an extremely great number of circuits and multiple functional macros. The term circuit designates an entity consisting of one or two cells or areas of silicon containing circuit components. The term macro designates an entity consisting of many cells arranged for a particular function, such as a memory or a programmable logic array (PLA).

Due to the complexity and the extremely great number of circuit components or cells that must be contained on one semiconductor substrate in a VLSI device or chip, a custom design approach is not practical. The custom design approach, as is known in the art, may be defined as a technique to obtain maximum utility of the area of the semiconductor substrate, or chip, for the circuits implemented on a particular substrate, or chip, by individually designing the component locations and metalization connections for each circuit. In the custom design approach, the chip designer is unconstrained and has essentially total freedom to optimize the design to meet the density and performance requirements of the application. However, these advantages are outweighed by the inherent deficiencies of the required design time and design expense.

Various different design approaches have been proposed and utilized in the art to reduce the deficiencies of the custom design approach. One effective approach implemented by the assignee of the present application is a master-image approach that is described in Donze et al., "Masterimage Approach to VLSI Design", *IEEE Computer* publication December 1983 pp. 18–25 and further described in Donze et al, "PHILO-A VLSI DESIGN SYSTEM", *IEEE-ACM* Nineteenth Annual Automation Design Proceedings, 1982 (ISSN 0146-7123, Library of Congress No. 76-150348). The disclosures of the above-identified publications are incorporated herein by reference. The PLA macro generation program described in these publications enables the chip designer to generate a variable-size PLA macro by varying the horizontal direction with the vertical direction fixed. The selected size PLA macro is designed prior to the physical design of the chip and stored as an entity in a design library.

The master image computer design system utilizes the library of predesigned circuits and functional macros. An overall chip image for a particular VLSI device is generated utilizing selected circuits and macros from the library that are placed on the chip image and then wired automatically to generate a physical description necessary to build the masks for the desired system. Automatic placement and wiring programs consist of placement, global wiring and detailed wiring routines. A delay calculator/optimizer program is used in conjunction with these routines for optimizing performance characteristics for the desired system.

Static random access memories (RAMS) are widely used in VLSI semiconductor devices. Present master image computer design systems generate semiconductor chip designs utilizing available versions of RAM macros having fixed sizes. Many of the predesigned RAM macros have been designed by custom design technique with high circuit density in order to minimize semiconductor area and to provide high performance characteristics for the memories. This custom RAM macro design approach, while providing individual, fixed size RAM macros with the advantages of high integration density and high speed, does not facilitate the generation or design of an individual RAM macro with a selected storage capacity. To the contrary, generating a design or physical description for a particular RAM macro having a particular desired storage capacity is normally a very time consuming and difficult task. Accordingly, chip designers typically select one of the available RAM macros from the library that has sufficient size for his particular application.

SUMMARY OF THE INVENTION

It is an important object of the invention to provide a macro structural arrangement that can be effectively and efficiently configured for a selected storage capacity including a selected number of words and a selected number of bits per word. Other principal objects of this invention are to provide an improved macro structural arrangement for a semiconductor integrated circuit device including a semiconductor substrate and two levels of metalization for defining conductive lines; to provide a macro structural arrangement to enable a selected functional array configuration that effectively utilizes semiconductor area to optimize both density and performance; to provide a macro arrangement that permits optimizing performance by selectively utilizing semiconductor area; to provide a macro configuration that facilitates its utilization in a master-image array of cells on the semiconductor chip with the macro cells differing in size from the master-image cells; to provide an improved macro arrangement to simplify the process of designing a macro with a selected storage capacity; and to provide a macro arrangement that facilitates the use of master-image computer design system to generate its physical design description.

In brief, the above and other objects and advantages of the present invention are provided with a macro generation method and a macro structural arrangement for a VLSI semiconductor circuit device. A functional macro is defined by a plurality of circuit blocks formed in a semiconductor substrate. The circuit blocks include at least one control block and at least one storage block. Each of the control blocks and the storage blocks comprises a plurality of predefined sections. The control block includes a control section, a bit decoder section, a word decoder section and a word selector section. Each of the storage blocks includes a memory section, a bit selector section and a sense latch driver section. One of a plurality of stored predetermined bit decoders is selectively provided for the bit decoder section responsive to a calculated minimum cell area for the resulting macro configuration. Alternatively an identified one of the bit decoders is selected that provides an optimal high speed or desired performance for the resulting macro configuration. Each of the bit decoders has uniform input and output connection configuration. A required number of storage blocks is identified responsive to the selected bit decoder for the selected number of bits per word. A required number of word selectors and memory array subsections is identified responsive to the selected bit decoder for the selected number of words.

DESCRIPTION OF THE VIEWS OF THE DRAWING

The present invention together with the above and other objects and advantages may best appear from the following detailed description of the preferred embodiment of the invention in which reference is made to the accompanying drawing wherein:

FIGS. 4A-4D are schematic diagram representations of different bit decoder sections of the arrangements of FIGS. 2 and 3;

FIGS. 5A-5D are representations similar to FIGS. 4A-4D of different bit selector sections;

FIG. 6A is a schematic diagram representation of a word decoder section of the arrangements of FIGS. 2 and 3;

FIG. 6B is a view similar to 6A of a word selector section;

FIGS. 7A-7C are enlarged, fragmentary plan views that together illustrate a single port random access memory macro of FIG. 1 when vertically aligned with FIG. 7A at the bottom, FIG. 7B in the middle and FIG. 7C at the top;

DETAILED DESCRIPTION

Figure 1:
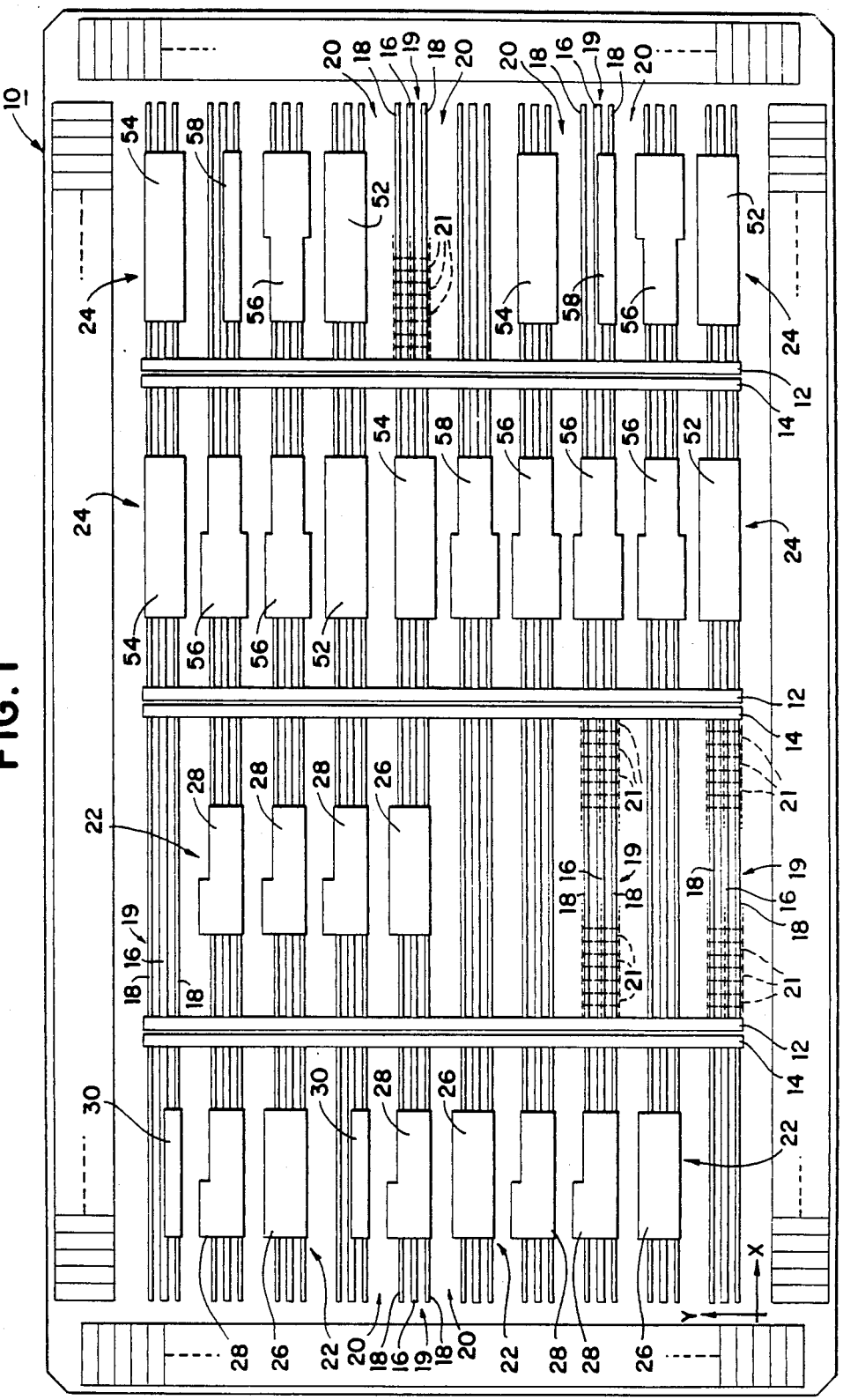
FIG. 1 is an enlarged plan view of a semiconductor chip including multiple macros that are arranged in accordance with the present invention.

Having reference now to FIG. 1, there is illustrated an exemplary layout of a VLSI chip 10. The present invention provides a macro structural arrangement that can be utilized with various integrated circuit technologies. Various conventional known photolithographic processes may be used for forming devices in a semiconductor substrate. Known processes are utilized for forming the metalization layers for wiring the devices. A detailed description of such conventional processes is not required for purposes of understanding the principles of the present invention. The VLSI chip 10 may be formed, for example, by field effect transistor (FET) technique with conventional complementary metal oxide semiconductor (CMOS) technology utilizing two metalization layers.

In the chip image 10, a first level of metalization M1 defines wiring lines conventionally extending in an X direction (horizontally as shown in FIG. 1). A second level of metalization M2 defines wiring lines conventionally extending in a Y direction, orthogonally to the first level M1 lines (vertically as shown in FIG. 1). Thus the first and second wiring lines are arrayed in an X-Y matrix or grid. The chip image 10 is defined within this grid system. The grid has dimensions corresponding to a first level metal M1 wiring pitch of, for example 3.2 micrometers by a second level metal M2 wiring pitch of 4.4 micrometers.

A power distribution system is provided by pairs of +5 Volt power supply and ground M2 power busses 12 and 14 to distribute power in the Y direction within the chip 10, as shown to divide the chip 10 into four similar quadrants. A plurality of +5 Volt power supply and ground M1 busses 16 and 18 are connected to the M2 power busses 12 and 14 and distribute power in the X direction. The M1 power busses 16 and 18 are arranged in a plurality of groups designated as 19 of a pair of ground busses 18 with a centrally positioned voltage supply bus 16. The M1 power bus groups 19 are spaced apart in the Y direction to define a wiring bay 20 extending in the X direction between each adjacent power bus group 19.

A standard size semiconductor substrate area is utilized to define a unit cell 21 such as those shown in dotted lines within the chip image 10. The term "cell" by itself refers to the standard image cell 21 that can contain a plurality of active and passive devices defining fundamental circuit elements employed to construct circuits within the chip 10. Each cell 21 has a fixed horizontal X dimension or width corresponding to a predetermined number of M2 lines and a fixed vertical Y dimension or height corresponding to a predetermined number of M1 lines. A plurality of unit cell locations are defined in a matrix array within the grid system of the chip 10 by dual rows within each of the M1 power bus groups 19 for interconnection with the voltage supply and ground busses 16 and 18. Each of the cells 21 has a physical cell boundary adjacent to the wiring bay 20 and logic service terminals are disposed at known X-Y positions along this cell boundary.

VLSI chip 10 includes multiple macros designated as 22 and 24. The illustrated macros 22 and 24 provide representative configurations that may be generated by a macro generation program in accordance with the principles of the present invention. Various different array macros can be easily configured to occupy a minimized overall area and exactly provide a selected storage capacity of a selected number of words and a selected number of bits per word. For purposes of illustration, the invention is described in connection with single port and dual port random access memories RAM1 and RAM2, but it should be understood that the principles of the present invention are not limited to the RAM macros.

Figure 2:
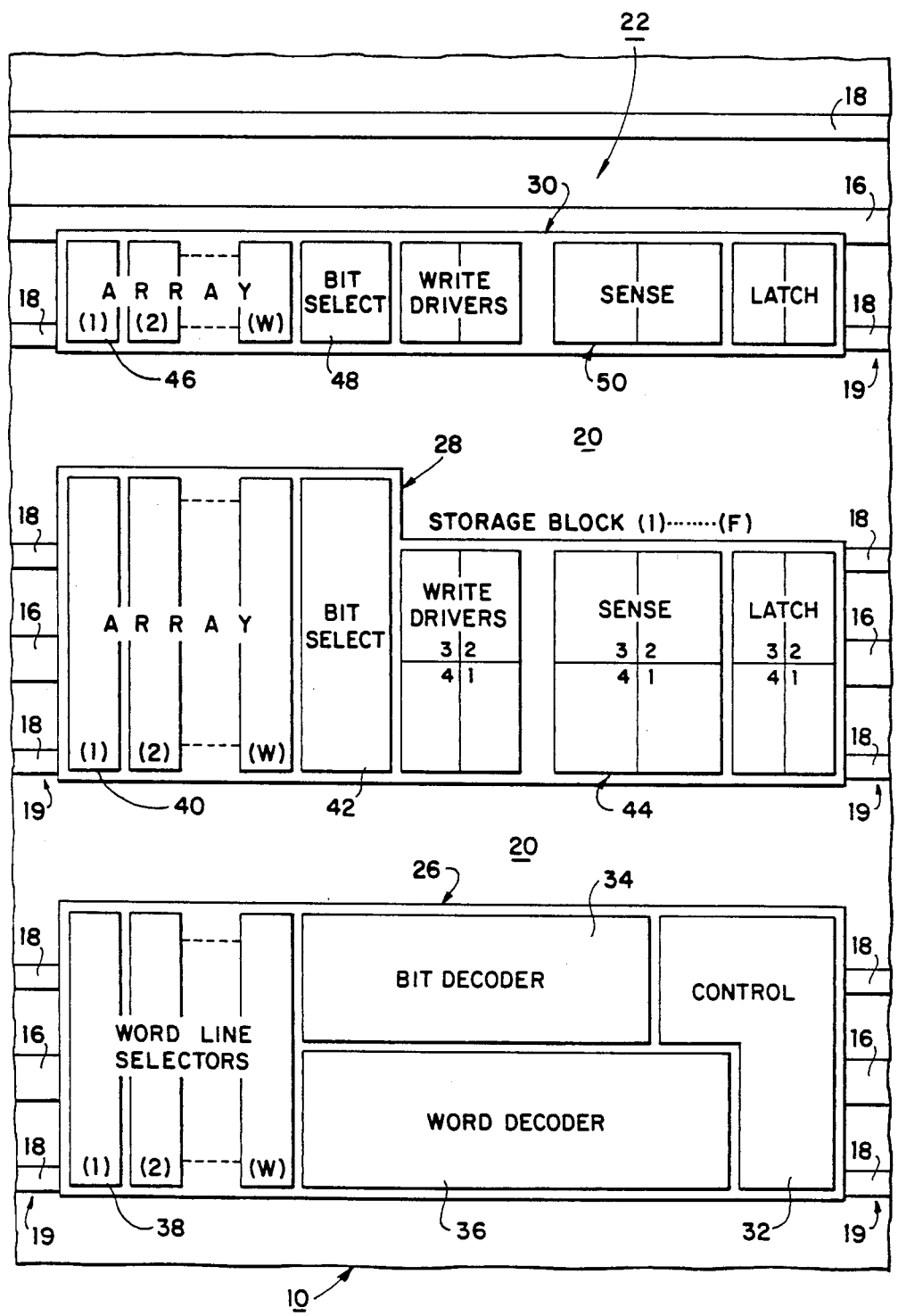
FIG. 2 is a block diagram view of a single port random access memory arrangement in accordance with the present invention.

FIG. 2 illustrates a single port RAM1 macro arranged in accordance with the present invention and designated in its entirety by the reference numeral 22. The RAM1 macro 22 includes a control block 26 and an identified number of full storage blocks (1)-(F) designated as 28 with one storage block 28 shown in FIG. 2. The RAM1 macro 22 may include a partial storage block designated as 30 depending on the selected storage capacity for the memory as is later described with respect to FIGS. 10A-10C.

The control block 26 includes a control section 32 for generating time signals, a bit decoder section 34 for decoding bit address inputs, a word decoder section 36 for decoding word address inputs and a word line selector section 38 for generating word line signals responsive to the decoded word address signals. Each of the storage blocks 28 includes a memory cell array section 40 for storing data, a bit line selector section 42 for generating bit line signals responsive to the decoded bit address signals and a sense, latch, driver section designated as 44 for sensing and latching READ/WRITE date and driving the data outputs. The partial storage block similarly includes a memory cell array section 46, a bit line selector section 48 and a sense, latch, driver section 50.

M2 lines are used for interconnecting the control block 26 with each of the storage blocks 28 and 30 as shown in FIGS. 7A-7C and 8A-8C. Word lines from the word line selector section 38 access each of the memory cell array sections 40 and 46 of the multiple storage blocks 28 and 30. Decoded bit address lines to the bit selector section 42 and timing lines to the sense latch driver section 44 are provided from the bit decoder section 34 and the control section 32, respectively, of the control block 26. Polysilicon bit lines from the bit line selector section 42 and 48 access the memory cell array sections 40 and 46 of the respective storage blocks 28 and 30 also shown in FIGS. 7A-7C and 8A-8C.

Figure 3:
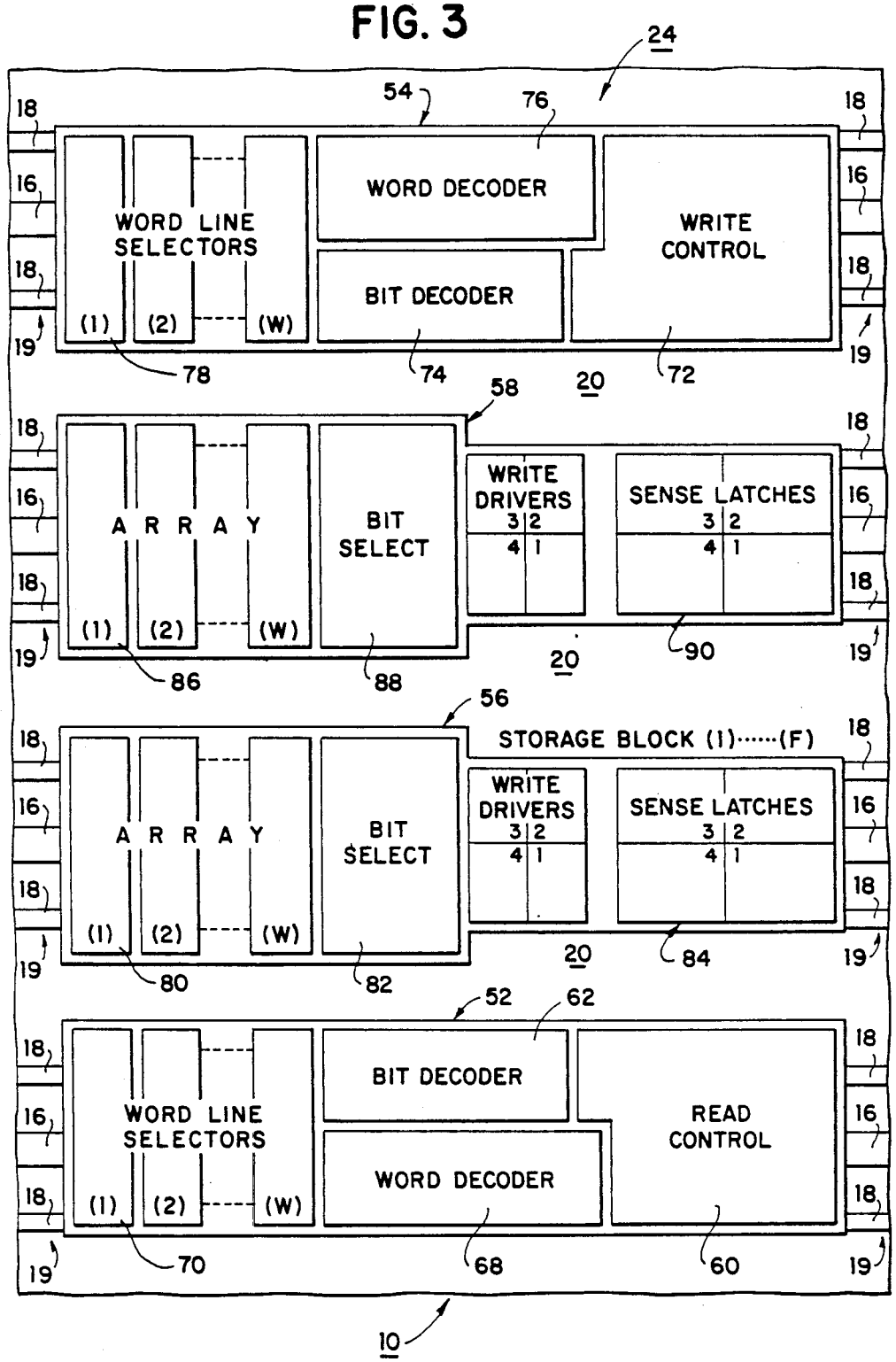
FIG. 3 is a view similar to FIG. 2 for a dual port random access memory arrangement.

FIG. 3 illustrates a dual port RAM2 macro arranged in accordance with the principles of the present invention and designated in its entirety by the reference numeral 24. The RAM2 macro 24 includes a first and a second control block 52 and 54 and an identified number of full storage blocks (1)-(F) designated as 56 with one storage block 56 shown in FIG. 3. RAM2 macro 24 similarly may include a partial storage block 58 depending on the selected storage capacity for the memory macro as is described with respect to FIGS. 10A-10C. Control blocks 52 and 54 permit independent READ/WRITE operations of the RAM2 macro 24. Control block 52 controls READ operations and control block 54 controls WRITE operations.

The control block 52 includes a read control section 60, a bit decoder section 62, a word decoder 68 and a word selector section 70. The control block 54 includes a write control section 72, a bit decoder section 74, a word decoder section 76 and a word selector section 78. Each of the full storage blocks 56 includes a memory cell array section 80, a bit selector section 82 and a sense, latch, driver section 84. The single partial array 58 similarly includes a memory cell array section 86, a bit selector section 88 and a sense, latch, drive section 90.

Both RAM1 and RAM2 macros are arranged to be configured to exactly provide a selected storage capacity of a selected number of words M and a selected number of bits per word N. Each of the word line selector sections 38, 70 and 78 and the corresponding memory sections 40, 46, 80 and 86 contain an identified, required plurality of subsections (2)-(W) for the selected number of words M as later described with respect to FIGS. 10A-10C.

Each of the memory subsections (2)-(W) within a full storage block 28 and 56 provides storage for a predefined number of bits, for example, eight bits. Similarly, each of the memory subsections (2)-(W) within a partial storage block 38 and 58 provides storage for a selected one of a plurality of a predefined numbers of bits. For example, a particular partial storage block memory subsection can provide a selected one of two, four or six bits.

Each of the bit decoder sections 34 of the RAM1 macro 22 and the bit decoder sections 62 and 74 of the RAM2 macro 24 are selectively provided by one of a plurality of predefined bit decoders that determine the overall configuration or shape of the RAM macro as will now be described.

In FIGS. 4A-4D, exemplary bit decoders are schematically illustrated that are selectably employed in the bit decoder section 34 or 62 and 74 to generate a dense RAM1 and RAM2 macro 22 or 24 of a particular M×N storage capacity. A 2:1 bit decoder 92 is schematically shown in FIG. 4A that includes a single bit address input B0 and includes logic function gates to provide two bit select outputs BS0 and BS1. A 4:1, 8:1, and 16:1 bit decoder 94, 96 and 98 are shown in FIGS. 4B, 4C and 4D, respectively. As schematically shown the 4:1 bit decoder 94 includes two bit address inputs B0 and B1 and includes logic function gates to provide four bit select outputs BS0, BS1, BS2 and BS3. Similarly the 8:1 bit decoder 96 includes three bit address inputs B0-B2 and provides eight bit select outputs BS0-BS7. The 16:1 bit decoder 98 includes four bit address inputs B0-B3 and provides eight bit select outputs BS0-BS3 and CS0-CS4.

The control blocks 36, 52 and 54 containing the bit decoder sections 34, 62 and 74 include four predefined X-Y input locations for logic service terminals (LST's) at the boundary adjacent to a wiring bay 20 for connection with the four possible B0-B3 bit address signal inputs. Eight possible predefined X-Y output locations are defined for each of the bit decoder sections 34, 62 and 74 for connection with the bit selector sections of each of the full and partial storage blocks 28, 30, 56 and 58. As shown and described with respect to FIGS. 7A-7C and 8A-8C, second metal M2 lines define the required interconnection wiring between the bit decoder sections of the control blocks 26, 52 and 54 and the bit selector sections of storage blocks 28, 30, 56 and 58.

FIGS. 5A-5D illustrate 2:1, 4:1, 8:1 and 16:1 bit selectors designated as 100, 102, 104 and 106 used in conjunction with corresponding bit decoders 92, 94, 96 and 98 of FIGS. 4A-4D. Bit selector 100 includes two bit line pairs that access the memory cell array section within a particular storage block. The bit select outputs BS0 and BS1 from the 2:1 bit decoder 92 are connected to the bit selector 100 that provides true and complementary outputs BLT and BLC that are applied to the sense, latch, driver section within the storage block. Bit selector 102 is similarly arranged for use with a 4:1 bit decoder 94. Bit selector 102 includes four bit line pairs and utilizes the bit select outputs BS0-BS3 to provide the outputs BLT and BLC. Bit selector 104 is arranged for use with a 8:1 bit decoder 96 and includes eight bit line pairs utilizing the bit select outputs BS0-BS7. Bit selector 106 is arranged for use with the 16:1 bit decoder 98 and includes a first selector stage of four 4:1 bit selectors 102 including sixteen bit line pairs that access two memory cell array sections of adjacent full storage blocks 28 and 56 utilizing the bit select outputs BS0-BS3. A second stage of a 4:1 bit selector 102 includes four interconnection line pairs with the four first stage bit selectors 102 utilizing the bit selector outputs CS0-CS3 of the bit decoder 98 to provide the bit select outputs BLT and BLC.

FIG. 6A provides a schematic representation of a word decoder 108 that can be used within the word decoder section 36, 68 and 76. The illustrated word decoder 108 receives a word address input A0 and provides decoded word select outputs AC0 and AT0. Multiple word decoders 108 are provided within the word decoder section depending on the number of word line selector subsections W for the RAM1 or RAM2 macro. For example, for sixty-four word line selector subsections, six word decoders 108 are utilized with the word address inputs A0-A5. Each of the control blocks containing a word decoder section 36, 68 and 76 includes predefined X-Y input locations for LST's adjacent the wiring bay 20 for connection with the word address inputs. Each word decoder section 36, 68 and 76 includes predefined boundary locations for the maximum possible number of decoded word select outputs AC0-AC5 and AT0-AT5.

FIG. 6B provides a schematic representation of a corresponding word line selector 110 that is used with the exemplary word decoder 108. As shown, the word line selector 110 includes a first stage with five inputs A1-A5 and a second stage with the decoded word select outputs AC0, AT0 to provide the word select output WL0-WL1 to access the corresponding memory cell array subsections. For a RAM configuration that includes only two word line selector subsections, the first stage of the word line selector 110 can be provided with a single input, with the five first stage inputs A1-A5 providing thirty-two possible combinations of the word decoder outputs.

Figure 7B:
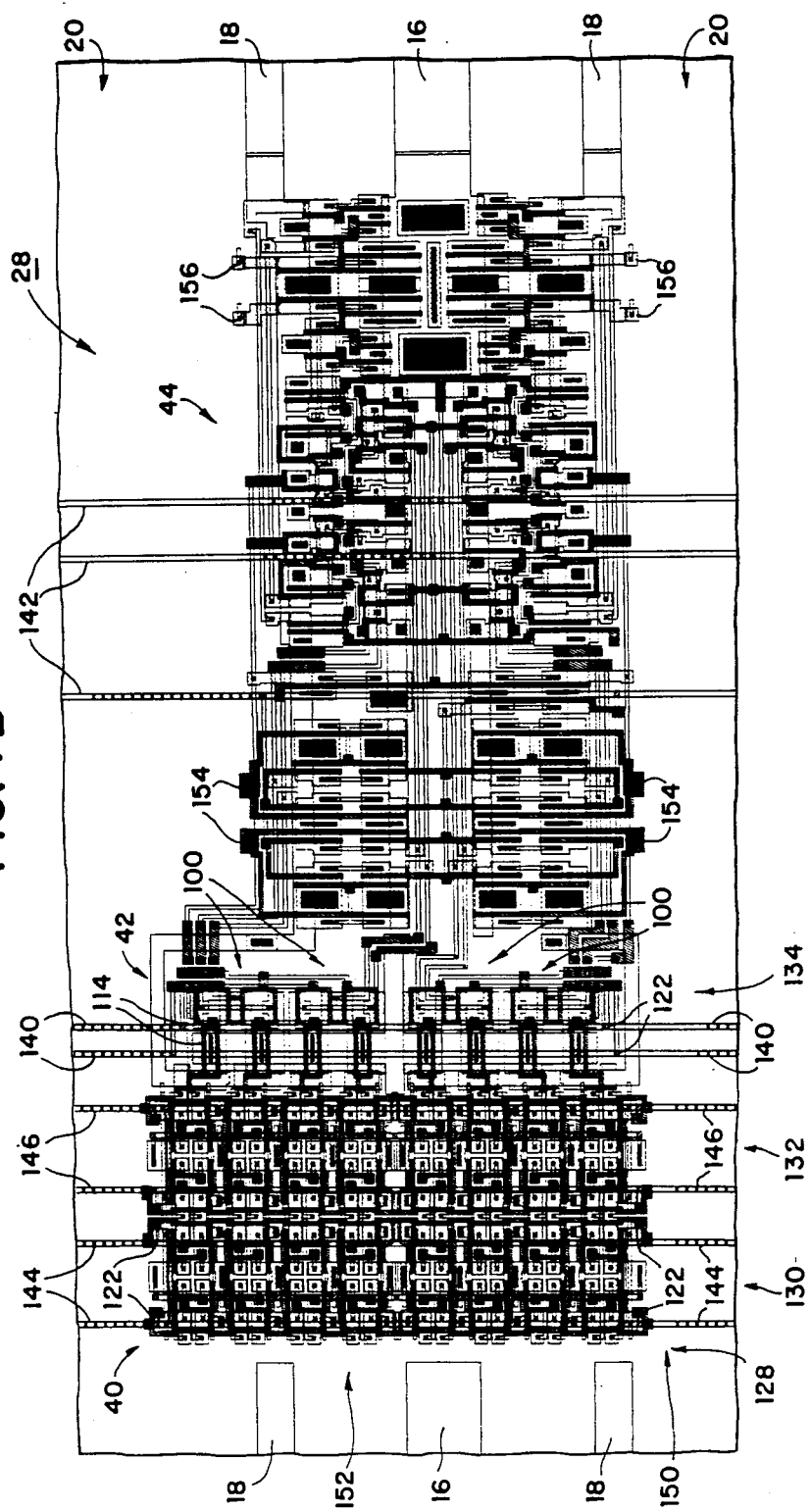

FIG. 7A includes a legend showing the shading illustrating the layers or mask levels of the chip 10 that will now be briefly described before describing the exemplary macro structural arrangements of FIGS. 7A-7C and 8A-8C. A diffusion (RX) level of the chip 10 is designated by the shading shown in box 112. A single polysilicon (P1) ohmic conductive layer utilized to form buried conductive lines for interconnecting within the active macro cell areas and for interconnecting the logic service terminals of the macro cells with the first metal M1 layer is shaded as shown in box 114. The first metal M1 lines are illustrated by horizontally extending unshaded M1 lines as shown in box 116. A mask level (CA) defines conductive via holes for interconnecting between the polysilicon P1 layer 114 and both the diffusion RX level 112 and the first metal M1 layer 116, as shown in box 118. Semiconductor N+ and P+ devices are proximate to the CA level 118 interconnections between the P1 layer 114 and the RX layer 112. In the exemplary CMOS chip 10, contacts to polysilicon and diffusion are about one micrometer by one micrometer. The second metal M2 layer is illustrated by vertically extending unshaded M2 lines as shown in box 120. A mask level (NV) defines conductive via holes for interconnecting between the M1 and M2 lines at selected point, shaded as shown in box 122.

Figure 7C:
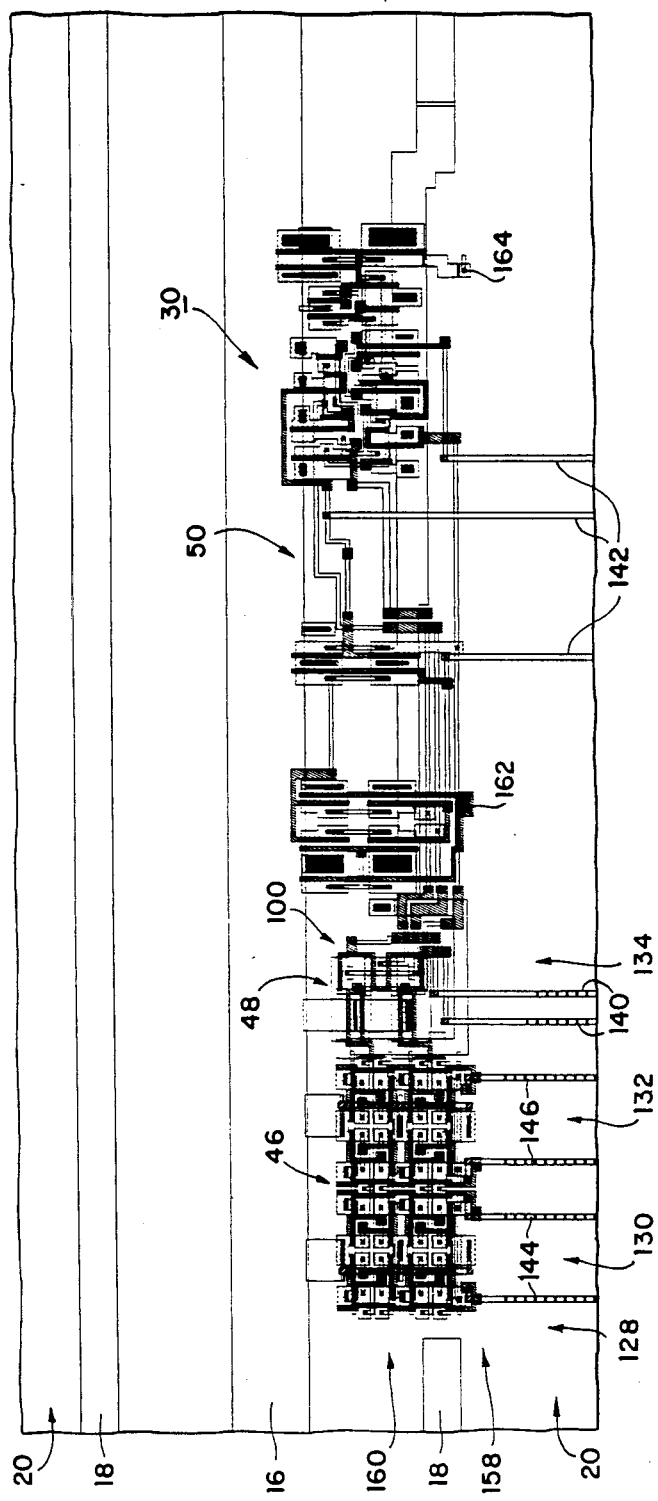

In FIGS. 7A-7C, there is shown an exemplary single port RAM1 macro 22 of FIG. 1 when vertically aligned with 7A at the bottom, 7B in the center and 7C at the top. In FIG. 7A, an exemplary control block 26 is illustrated that includes sections 32, 34, 36 and 38. Control block 26 can be visualized as an array of a first and second rows generally designated as 124 and 126 including a number of columns designated by the reference numerals 128, 130, 132 and 134. Each of the columns of both rows is defined by selected ones of a plurality of predefined macro cells separately including a plurality of corresponding semiconductor structure and M1 circuit cells (PERLEV1) and second metal M2 wiring cells (PERLEV2) as described later with respect to FIGS. 9 and 10A-10C. These corresponding predefined circuit cells and macro wiring cells are stored in a control library family.

When viewed from left to right, the first column 128 in row 124 is defined by a selected corresponding circuit and wiring cell of a plurality of predefined macro space cells contained within the control library family. A particular macro space cell is selected so that the resulting boundary of the control block 26 hits or matches a standard image cell 21 within the grid system of chip 10. The second and third columns 130 and 132 in row 124 are defined by PERLEV1 and PERLEV2 word line selector cells 110 that are separately stored corresponding to odd and even column position. The last column 134 of row 124 is defined by selected PERLEV1 and PERLEV2 bit decoder cells that correspond to a selected one of the 2:1, 4:1, 8:1, or 16:1 bit decoders 92, 94, 96 or 98. The 2:1 bit decoder 92 is shown within the bit decoder section 34 for the exemplary RAM1 macro 22 of FIGS. 7A-7C.

Row 126 of the control block array is similarly defined and includes a selected macro empty cell at column position 128, a low order address bit AC1 personalization cell at column position 130, an address bit AT1 personalization cell at column position 32 and a selected macro INPUT/OUTPUT (I/O) cell at column position 134. The address bit AC0 and AC1 personalization cells are nested within the word line selector cells 110. Nested within the selected I/O cells are the word decoder section 36 and the control section 32. The column 128 macro empty cell is selected so that the lower boundary of the control block 26 matches the physical cell boundary of the image cell 21 adjacent to the wiring bay 20.

A plurality of logic service terminals (LST's) 138 are disposed along the column 134 I/O cell boundary adjacent the wiring bay 20. An X-Y position is predefined for each of the required LST's utilized for connection with the exemplary possible eight bit address inputs B0-B7 and six word address inputs A0-A5 with selected LST's utilized for connection with address input signals. In the exemplary RAM macro 22 of FIGS. 7A-7C, the LST's 138 are utilized for interconnections with the single bit address input B0 for the 2:1 bit decoder 92 and word address inputs A0 and A1 for the word decoders 108.

A plurality of output locations are predefined for each of the exemplary possible eight bit select outputs BS0-BS7 or BS0-BS3 and CS0-CS3 within the bit decoder section 34 with a particular bit decoder 92, 94, 96 and 98 selectively utilized to define the section. In the 2:1 bit decoder 92, the bit select outputs BS0 and BS1 are interconnected with a pair of M2 lines 140 at the predefined locations of via holes 122. The timing and clock signals of the control section 34 are applied to the M2 lines 142 at the predefined location of via holes 122.

A first and second output location is predefined for each of the word line selector cells 110 within the section 38. The word select outputs WL0 and WL1 of the word line selector cell 110 at column 130 are interconnected with a pair of M2 lines 144 at the predefined locations of via holes 122, as shown. Similarly, a pair of M2 lines 146 are interconnected with the word line output WL2 and WL3 of the word line selector cell 110 at column 132.

In FIG. 7B, an exemplary storage block 28 is illustrated that includes sections 40, 42 and 44. Storage block 28 similarly can be viewed as an array of first and second rows generally designated as 150 and 152, including the vertically aligned columns 128, 130, 132 and 134. The first row 150 is defined by selected empty cells for each of the column positions. The empty cell row 150 is selected so that the lower boundary of the storage block 28 matches the physical cell boundary of the image cell 21 adjacent the wiring bay 20. Row 152 includes a selected space cell at column position 128, a first memory array cell at column position 130, a second memory array cell at column position 132 and a selected macro I/O cell at column position 134. The eight-bit high first and second memory array cells are separately stored within the macro cell library corresponding to even and odd column positions. Nested within the I/O cell at column position 134 are the bit selector section 42 and the sense, latch, driver section 44. A plurality of locations are predefined within the sections 40, 42 and 44 for connection with the M2 control signal lines 144, 146, 140 and 142 as shown by the location of the via holes 122.

Each of the memory array cells at column positions 130 and 132 produce eight output bits. Four 2:1 bit selectors 100 are used within the bit selector section 42 of the selected I/O cell at column position 134 to provide the eight-bit line pairs. Eight bit line pairs are provided at predefined locations from the bit selector section 42 to the memory array cells by polysilicon lines 114. In the illustrated storage block 28, four sense, latch, write drivers are provided within the section 44 with data input LST's 154 provided at predefined X-Y locations along an upper and lower I/O cell boundary adjacent wiring bays 20. Similarly, data output LST's are provided at predefined X-Y locations along the upper and lower boundaries of the I/O cell at column position 134.

FIG. 7C provides and exemplary partial storage block 30 including sections 46, 48 and 50. Partial storage block 30 includes an empty cell row 158 and a second row 160 that includes a space cell at column position 128, a first and second memory array cell at columns 130 and 132 and an I/O cell at column position 134. Each of the illustrated memory array cells within the section 46 provides two output bits. A single 2:1 bit selector 100 is utilized within the bit selector section 48. Two pairs of polysilicon bit selector lines access the memory array cells, as shown. A data input LST 162 and a data output LST 164 are disposed at predetermined positions along the lower I/O cell boundary adjacent the wiring bay 20. A plurality of locations are predefined within the sections 46, 48 and 50 for connection with the M2 control signal lines 144, 146, 140 and 142 by the via holes 122, as shown.

Figure 8A:
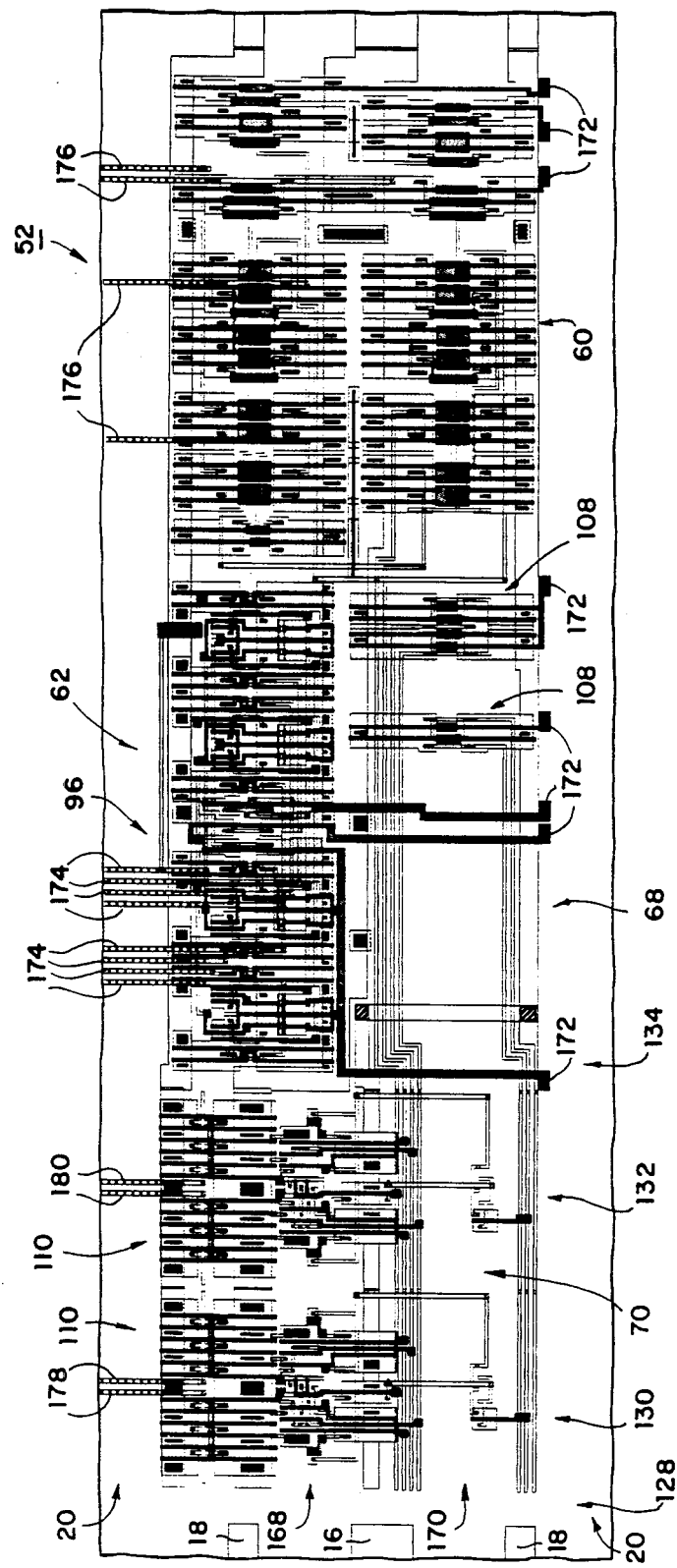
FIGS. 8A-8C are views similar to FIGS. 7A-7C that illustrate portions of a dual port random access memory macro.
Figure 8B:
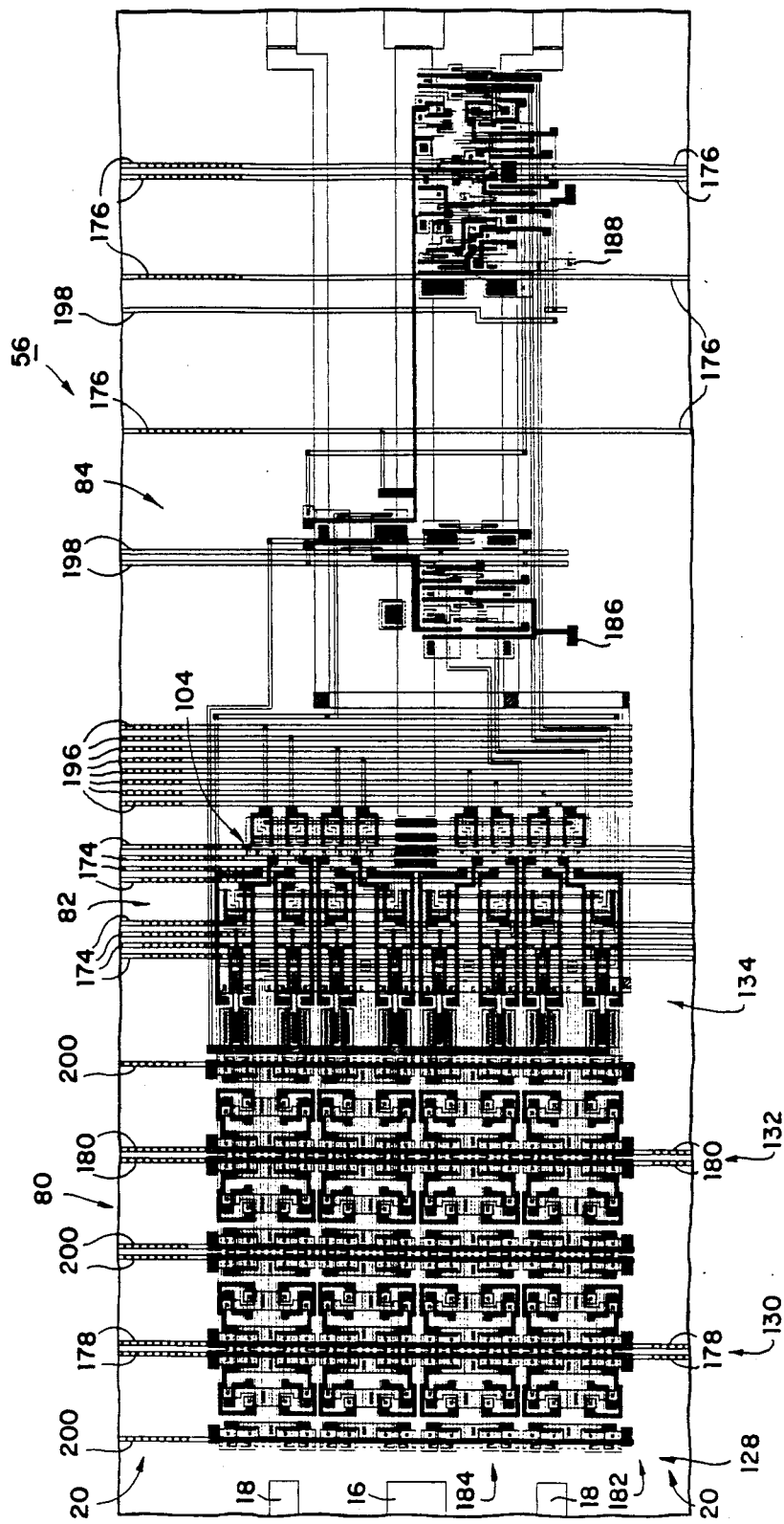
Figure 8C:
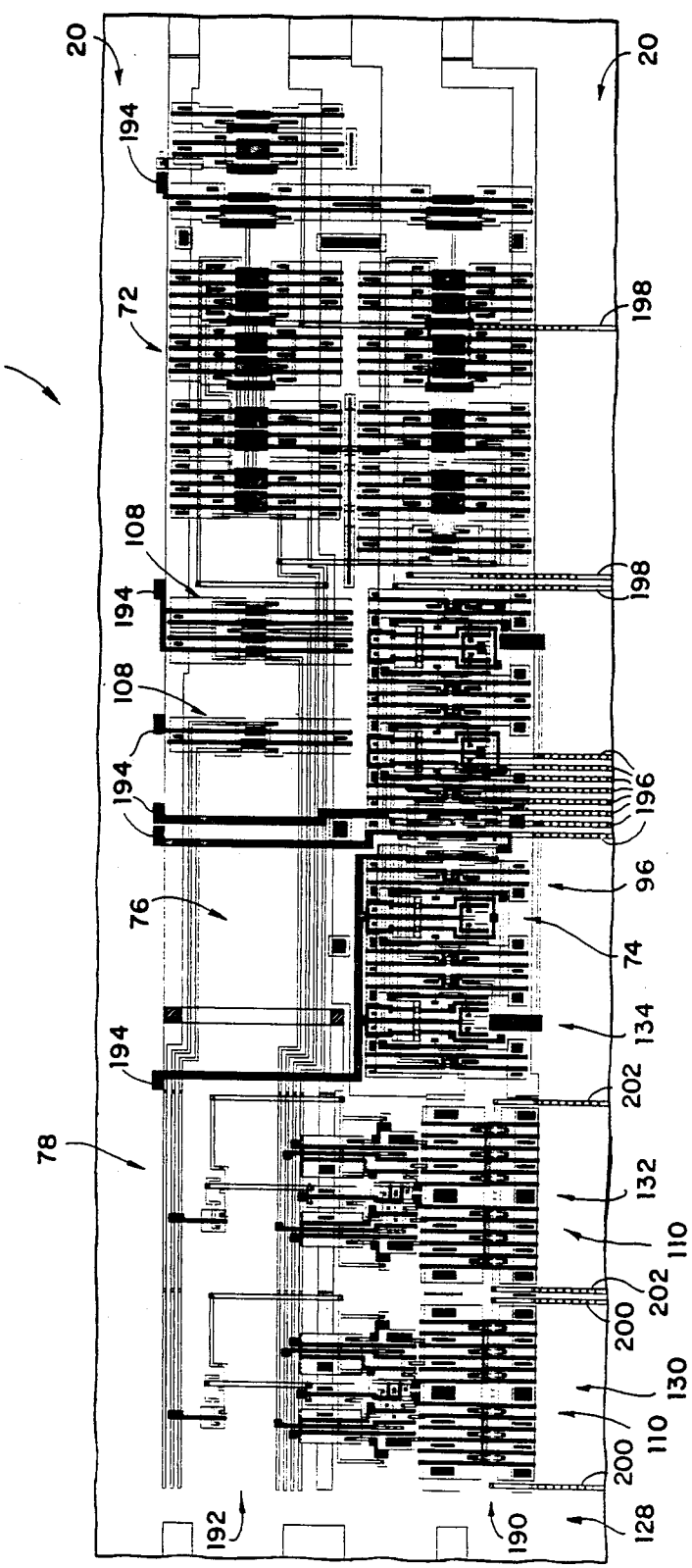

FIGS. 8A-8C illustrate exemplary portions of a dual port RAM2 macro 24 of FIG. 1. In FIG. 8A, an exemplary read control block 52 is illustrated that includes sections 60, 62, 68 and 70. FIG. 8B provides a corresponding exemplary storage block 56 with sections 80, 82 and 84. FIG. 8C illustrates an exemplary write control block 54 including sections 72, 74, 76 and 78. In the exemplary read and write control blocks 52 and 54, first and second word line selectors 110 are illustrated, thus resulting in a total of four columns designated by the same reference numerals 128, 130, 132 and 134 as used for the RAM1 macro 22 of FIGS. 7A-7C.

Referring now to FIG. 8A, the read control block 52 includes a first and second rows generally designated by the reference numerals 168 and 170, each including the columns 128, 130, 132 and 134. The first row 128 includes the first column 128 of a space cell, the next two successive columns 130 and 132 of word selector cells 110 and the last column 134 of a selected 8:1 bit decoder cell 96. The second row 170 includes the first column 128 of an empty cell, the next successive columns 130 and 132 of word address personalization cells and the last column 134 of an I/O cell that includes the word decoder section 68 and the read control section 20. Input LST's 172 are disposed along the column 134 I/O cell boundary adjacent the wiring bay 20 for connection with the bit and word address inputs to the read control block 52.

In the exemplary read control block 52 of FIG. 8A, five LST's 178 are utilized for interconnection with the three bit address inputs B0-B2 and the word address inputs A0 and A1. In the 8:1 bit decoder 96, the eight bit select outputs BS0-BS1 are interconnected with a corresponding eight M2 lines 174 at the predefined location of via holes 122. Similarly, timing lines from the read control section 60 are connected with a plurality of M2 lines 176 at the selected locations of via holes 122. In the word selector section 70, the word line outputs WL0 and WL1 are interconnected with a pair of M2 lines 178 at the predefined location of via holes 122 within the word selector cell 110 at column position 130. Likewise, the word line outputs WL2 and WL3 are interconnected with a pair of M2 lines 180 at the predefined locations of via holes 122 within the column 132 word selector cell.

FIG. 8B illustrates a full storage block 56 utilized with the read control block 52 and the write control block 54. Storage block 56 is defined by a first row 182 of selected empty cells at columns 128, 130, 132 and 134. A second row 184 includes the first column 128 of a space cell, the next successive columns 130 and 132 of memory array cells and the last column 134 of an I/O cell. Nested within the selected I/O cell are the bit selector section 82 and the sense, latch, driver section 84. The bit selector section 82 contains an 8:1 bit selector cell 104 that provides eight polysilicon bit line pairs that access the eight-bit high memory array cells within section 80. A single sense, latch, write driver is shown within the section 84 with the BLT and BLC outputs of the bit selector section 104 provided by M1 lines within the I/O cell. A data input LST 186 is provided at a predefined X-Y position along the column 134 I/O cell boundary for connection with a data input signal. A data output LST 188 is similarly provided for the data output signal.

FIG. 8C illustrates the write control block 54 including first and second rows 190 and 192. Row 190 includes a first column 128 of a space cell, the next successive columns 130 and 132 of word selectors 110 and the last column 134 of the bit decoder 74. Row 192 includes the first column 128 of an empty cell, the next successive columns of 130 and 132 of address bit personalization cells and the last column 134 of the selected I/O cell that includes the word decoder section 76 and the write control section 72. A plurality of LST's 194 are disposed adjacent the column 134 I/O cell boundary for connection with the bit and word address inputs. The exemplary write control block 54 includes corresponding LST's 194 for connection with the utilized bit address inputs B0-B3 and the word address inputs A0 and A1. The bit select outputs of the 8:1 bit decoder 96 are provided at the predefined locations of the via holes 122 for connection with eight M2 lines 196. Timing signals from the write control section 72 are provided at the predefined locations of via holes 122 for connection with the M2 lines 198. In the column 130 word line selector 110, the word line outputs WL0 and WL1 are interconnected with a pair of M2 lines 200 at the predefined locations of the via holes 122. Likewise, the word line outputs WL2 and WL3 are interconnected with a pair of M2 lines 202 at the predefined locations of via holes 122 within the column 132. The write control signals are interconnected with the storage blocks 56 by the M2 lines 196, 198, 200 and 202 as shown in FIG. 8B.

The method for generating macros of the present invention can advantageously be implemented in a computer design automation system known as IBM's Engineering Design System (EDS). IBM's EDS is described in Worthman, "Design Automation:", *VLSI SYSTEMS DESIGNS USERS GUIDE TO DESIGN AUTOMATION,* pages 14–22, 1987. The disclosure of the above-mentioned publication is incorporated herein by reference. In brief, this EDS utilizes a mainframe computer system, specifically, IBM's System/370 and a library of programs for an interactive physical design process of VLSI chips.

Figure 9:
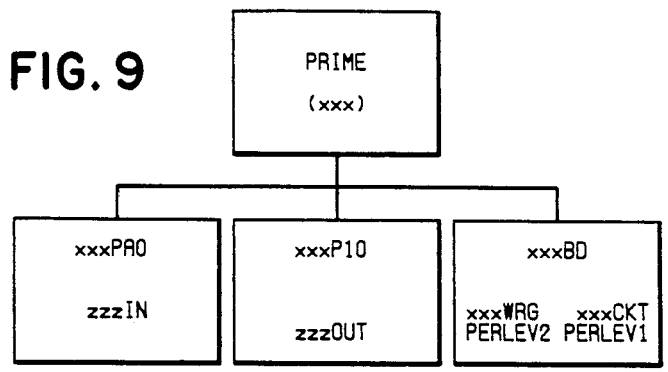
FIG. 9 is a diagram illustrating the nesting structure for the macro generation program.

Referring now to FIG. 9, there is shown a diagram illustrating a nesting structure for the macro generation program of the invention. Parallel processes represented by a plurality of lower blocks (xxxPAO, xxxP10 and xxxBD) are performed to generate the physical description for a particular macro represented by an upper block (PRIME). A plurality of predefined macro cells are stored in a design library including a plurality of families for defining each of the subsections and sections within the control blocks 26, 52 and 54, the full storage blocks 28 and 56, and the partial storage blocks 30 and 58. The predefined macro cells contain standardized PERLEV1 circuit and PERLEV2 wiring layouts for each of the sections and subsections. A particular RAM1 or RAM2 macro is defined by identified ones of these predefined macro cells that have different sizes than the image cells 21, as illustrated in FIGS. 1, 7A–7C and 8A–8C. The predefined macro cells separately include corresponding PERLEV2 second metal M2 wiring cells used in conjunction with PERLEV1 combined semiconductor and M1 wiring cells because the second metal must be defined or real for testing of the macro structure for the physical design and global testing of the particular macro.

Signal inputs zzzIN including address and data input signal connections are identified at the block xxxPAO for defining input LST's. Signal outputs zzzOUT for output data signal connections are identified at a block xxxP10 for defining output LST's. A second metal level (PERLEV2) xxxWRG and a circuit level (PERLEV1) xxxCKT are separately nested to define a body cell xxxBD. A particular macro resulting from these parallel processes at blocks xxxPAO, xxxP10 and xxxBD is defined at the block PRIME in a form of a library entity that can be selected for use in VLSI chip 10.

Figure 10A:
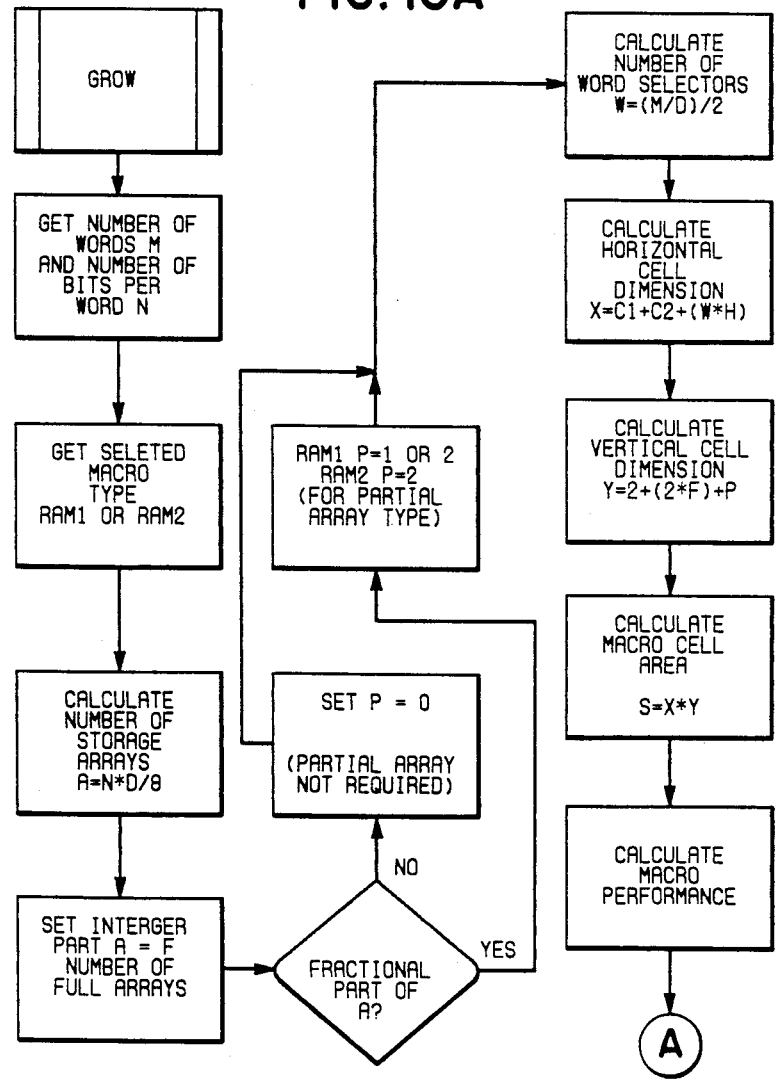
FIGS. 10A-10C are flow charts that illustrate logical steps performed by a program for generating macros.
Figure 10B:
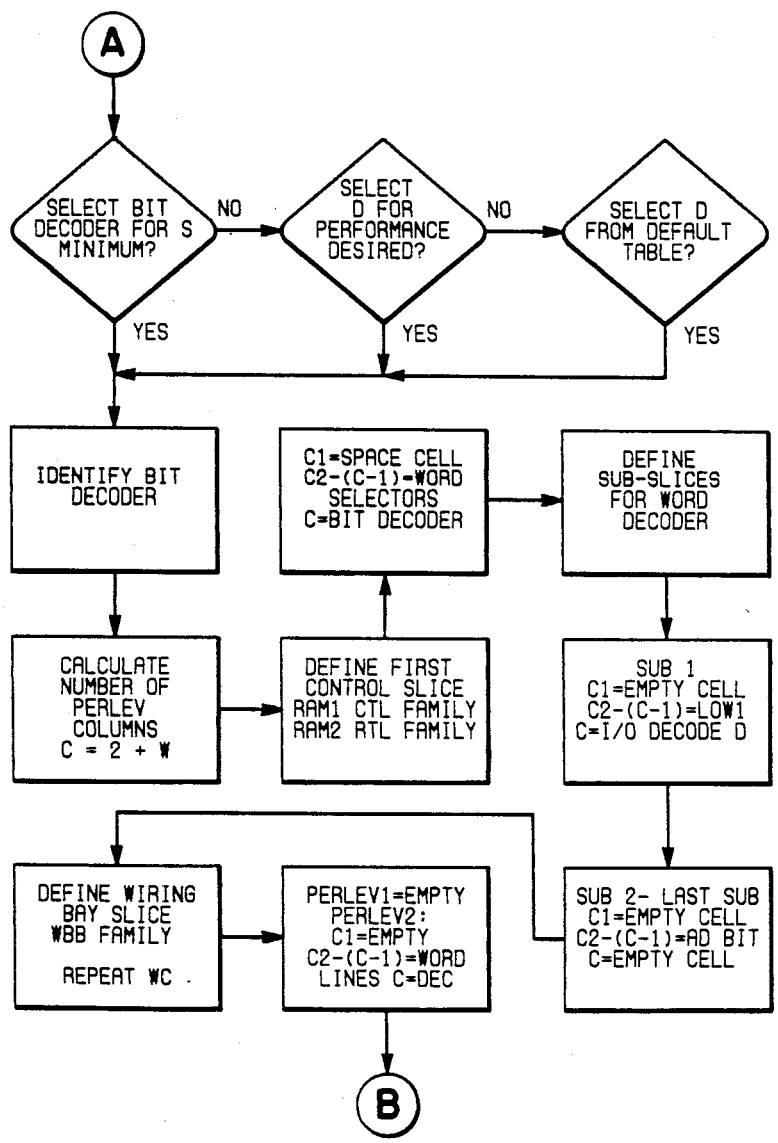
Figure 10C:
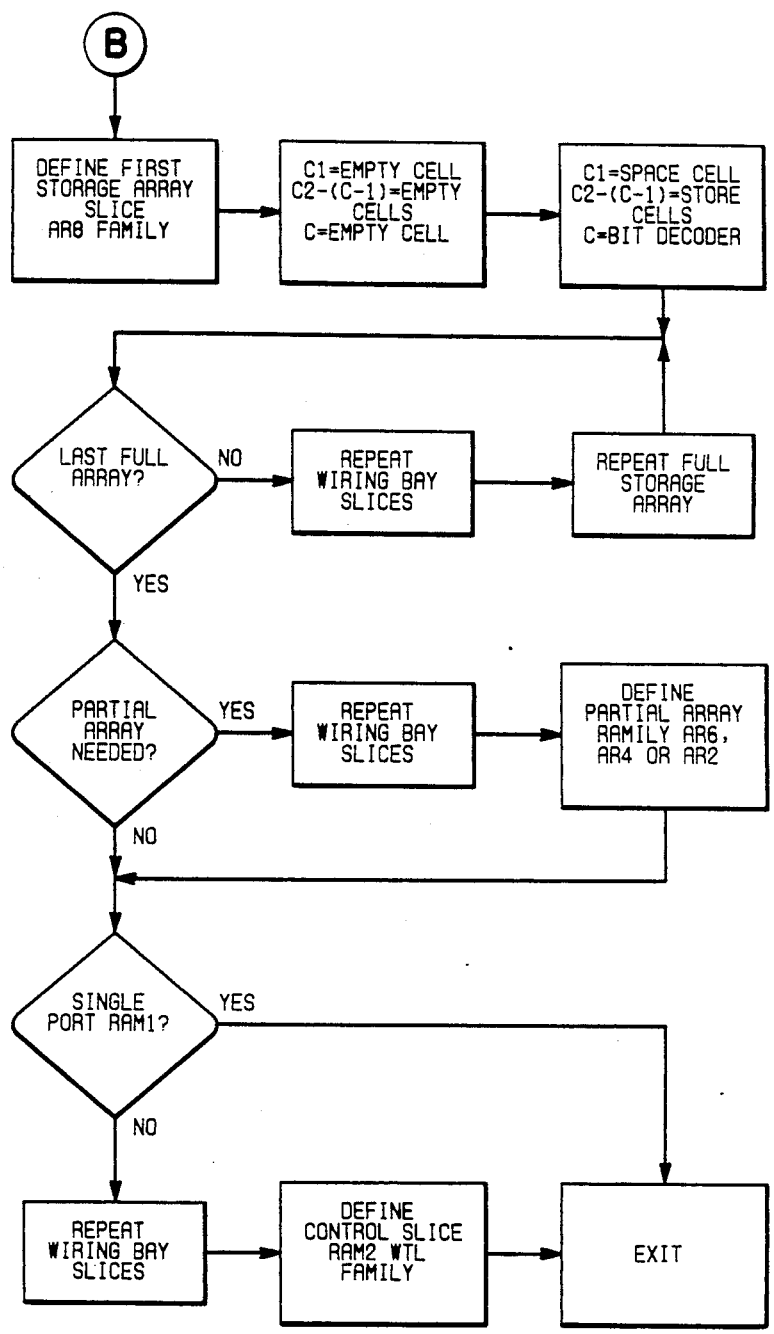

Referring now to FIGS. 10A–10C, there are shown flow charts that illustrate logical steps performed by the macro generation program in accordance with features of the invention. The macro generation subroutine GROW begins by identifying the user input selections of the number of words M, the number of bits per word N and the single or dual port arrangement for a particular macro M×N RAM1 or RAM2. An optimal configuration for the selected M×N RAM macro is determined by calculating a macro area and performance resulting from each of the four possible bit decoder 2:1, 4:1, 8:1 and 16:1 as follows.

A total number and type of required storage blocks are first determined by multiplying the number of bits per word (N * D)/8=A, where D=2, 4, 8 and 16, respectively for a bit decoder 2:1, 4:1, 8:1, and 16:1. An integer part of the resultant value of A equals the required number of full, eight-bit high storage blocks indicated as F. A partial storage array is required when the resultant value A includes a fractional part. The value of the fractional part of A determines the size of a partial array, if required. When a partial array is not required, a value P representative of the cell area for a partial array is set equal to zero. For a single port RAM1 with a fractional part of A equal to 0.25, a 2 bit partial array is defined by a 1 cell high partial array section indicated as P=1. Otherwise, when a fractional part of A equals 0.50 or 0.75, a 4bit array or 6 bit array is defined by a 2 cell high partial array section indicated as P=2. For a dual port RAM2, any required 2-, 4- or 6-bit partial array is defined by a 2 cell high partial array section, with P=2. For example, for a selected number of words M equal to sixty-four and for a selected number of bits per word N equal to nine or a 64×9 RAM1 and RAM2, A=2.25, 4.5, 9 and 18, respectively for D=2, 4, 8 and 16. For both the RAM1 and RAM2 macros, the resulting number of full storage blocks F=2, 4, 9 and 18. For the RAM1 macro, the cell height for the resulting partial storage block P=1, 2, 0 and 0. Similarly for the RAM2 macro, P=2, 2, 0 and 0.

Next a required number of word selectors W is determined for each of the bit decoders 92, 94, 96 and 98 by calculating W=(M/D)/2, for D=2, 4, 8 and 16. The value for W must be an even number and greater than or equal to 2, so that any resulting odd number would be incremented by one. For the 64×9 RAM1 and RAM2 example, W =32, 16, 8 and 4, respectively for D=2, 4, 8 and 16. Having calculated the required number of storage arrays F and P and word selectors W, a horizontal and vertical dimension in cells resulting with each of the four bit decoders is then determined. The horizontal dimension in cells is determined by the following calculation:

$$X = c1 \pm c2 + (W*H)$$

where c1 is a predetermined overhead constant, for example, equal to 17,and c2 equals 1 for a space cell utilized to match an image cell boundary and H is a horizontal periodicity value determined by the relative width of a macro array cell to an image cell, for example, such as, equal to 2.25. The resulting value for X=90, 54 36 and 27 with D=2, 4, 8, 16 respectively for the selected 64×9 RAM1 or RAM2 macro.

The vertical dimension in cells is determined by the following calculation:

$$Y = 2*CB + (2*F) + P$$

where the constant 2 equals the control section height for each of the control blocks CB and F is the number of full storage blocks, each 2 cells high, and P equals 0, 1 or 2 for the cell height of the partial array. For example, for the example of the 64×9 RAM1, CB equals 1 so that the resulting value for Y is 7 with D=2 and Y=12, 20, 38 with D=4, 8, and 16 respectively. Similarly, for the example of the 64×9 RAM2, CB equals 2 resulting in a value for Y of 10 with D=2 and Y=14, 22, 40 with D=4, 8, and 16, respectively.

Now the resulting area in cells corresponding to each bit decoder 2:1, 4:1, 8:1 and 16:1 is determined by calculating:

$$S = X * Y$$

For the example 64×9 RAM1 macro, S=630, 648, 720 and 1026 for D=2, 4, 8 and 16, respectively. Similarly for the selected 64×9 RAM2 macro, S=900, 756, 792 and 1080 for D=2, 4, 8 and 16.

A performance characteristic for each resulting macro configuration is determined by calculating the delay time for each by conventional simulator programs.

Finally a required number of rows of M2 wiring WBB family cells for connections across the wiring bays is determined by the following calculation:

$$WC=(BW-2*CH)/HP$$

where BW equals the wiring bay dimension, for example, 227.2 or 192.0 micrometer, CH equals the array cell height, for example, 92.8 micrometers and HP equals the horizontal wire periodicity or M1 wiring pitch, for example, 3.2 micrometers. Utilizing the above exampled values, the resulting number of wiring bay rows WC equals 17 with BW equal to 227.2 and WC equals 2 with BW equal to 194 micrometers.

Referring now to FIG. 10B, the sequential steps continue at the entry point labeled A. One of the bit decoders 92, 94, 96 and 98 is now selected for use in the M×N RAM1 or RAM2 macro being generated. A particular bit decoder can be selected to provide a macro configuration with a minimum area by comparing the calculated macro area S for each of the bit decoders 92, 94, 96 and 98 and selecting the particular bit decoder resulting in an identified minimum area S. Alternatively, a particular bit decoder may be selected that provides a desired performance level specified by the chip designer. The determined performance characteristics for each macro configuration corresponding to the bit decoders 92, 94, 96 and 98 are compared to identify the desired performance value and a bit decoder is selected resulting in the desired performance value. Alternatively, when otherwise unspecified, a particular bit decoder may be selected from a default table with the bit decoders 92, 94, 96 and 98 corresponding to the selected number of words. An exemplary default table for the RAM1 and RAM2 configuration follows:

| RAM1 M words | Bit Decoder | RAM2 M words |
|---|---|---|
| 8-160 | 2:1 | 8-72 |
| 161-320 | 4:1 | 73-144 |
| 321-640 | 8:1 | 145-288 |
| 641-1024 | 16:1 | 289-512 |

The selected bit decoder is then utilized to determine the number of columns C for the macro configuration by the following calculation:

$$C=2+W$$

where W equals a required number of word selectors, with the constant 2 provides for a first column and a last column.

Having identified the bit decoder and number of columns, the physical design description of the particular RAM1 or RAM2 macro begins with the control block 26 or the read control block 52. A first control block slice or row is sequentially defined from first through last column position by selected macro cells from a control or read control family library. As illustrated and described with respect to FIGS. 7A and 8A, a first column (C1) is defined by a selected space cell. A second column (C2) is defined by an even column word line selector cell. A third column (C3) is defined by an odd column word line selector cell. Next successive columns through the next to the last column (C-1) are sequentially defined by even and odd word line selector cells corresponding to column position. A last column (C) is defined by the selected bit decoder cell. Next a required number of sub-slices or subsequent rows for personalizing the word line selector cells is identified corresponding to word address input bits A1-A5. A low order word address input bit A0 is "pre-personalized" or nested within the word line selector cells so that, for example, for the predefined minimum of two word line selector cells, one subsequent row or a second row is required corresponding to the word address input bit A1 as shown in FIGS. 7A and 8A. Further, for example, for thirty-two word line selector cells, five subsequent rows are required with each successive row for the word address inputs A1-A4, respectively.

A second row includes the first column C1 defined by an empty cell. The next successive columns C2-(C-1) are defined by word address true and complementary A1 personalization cells corresponding to even and odd column position. The last column C of the second row is defined by a selected I/O cell. For a RAM1 macro, the column C I/O cell includes the word decoder section 36 and the control section 32. Similarly, for a RAM2 macro, the column C I/O cell includes the read word decoder section 68 and the read control section 60. For either a RAM1 or RAM2 macro, a particular I/O cell is selected corresponding to the number word address decoders 108 required for the utilized ones of word address inputs A0-A5 depending on the number of word line selector cells.

Each of the next successive row or rows includes the first column C1 defined by an empty cell, next successive columns C2-(C-1) defined by true and complementary word address personalization cells and the last column C defined by an empty cell. An increasing low order word address bit is utilized for the successive rows, for example A2 for a third row and A5 for a sixth row.

Next a wiring bay slice or row is sequentially defined from the first column C1 through the last column C by selected macro cells from a wiring bay family library. The first wiring bay row includes the first column C1 defined by an empty cell. The next columns C2-(C-1) are defined by array bay metal macro cells corresponding to even and odd column position. The last column C is defined by an array bay metal macro cell that is selected corresponding to the selected bit decoder. The PERLEV1 circuit cells are defined by selected wiring bay family empty cells for each column position. Subsequent identical wiring bay rows are defined as required. The required number of wiring bay rows equals the previously calculated value WC.

Referring now to FIG. 10C, the sequential steps continue following entry point labelled B. A first full storage block 28 or 56 is now defined. A first storage block slice or row is sequentially defined from first through last column position by selected macro cells from a selected storage family library. A storage family library is selectively utilized for the full storage block responsive to the selected bit decoder, for example with a corresponding family for a selected 16:1 bit decoder and a corresponding family for either of the 2:1, 4:1 or 8:1 bit decoders.

As illustrated in FIGS. 7B and 8B, a first row is defined by selected empty cells for each of the columns C1-C. A second row includes the first column C1 defined by a selected empty cell. Next successive columns C2-(C-1) are defined by memory array cells corresponding to even and odd column position. The last column C is defined by a selected I/O cell responsive to the selected bit decoder. Nested within the column C I/O cell is the bit selector section 42 and the sense, latch, write section 44 for the RAM1.

When it is determined that another full storage block is required, then the required wiring bay rows are defined and the next storage block is defined.

After the last required full storage block has been defined, if a partial storage block is required, then the required wiring bay rows are defined before the partial storage block is defined. The partial storage block is defined from a selected partial storage family corresponding to the required partial array size, for example for one of 2, 4, or 6 bits. The partial storage block includes identical types of cells for each of the columns of the identical first and second rows as described for the full storage block. After the partial storage block is defined the RAM1 macro is completed. Otherwise, when a partial storage block is not required, the RAM1 macro is completed with the last full storage block defined.

For a selected RAM2 macro, after a required partial storage block is defined or if not required after the last full storage block is defined, then the required wiring bay rows are repeated. A write control block 54 is then defined for the RAM2 macro. As illustrated in FIG. 8C., the write control block 54 is defined by first and second rows including the identical types of cells by column position as the read control block 52, except selected from a read control family.

Various different storage capacities can be provided for a desired RAM1 and RAM2. For example, the RAM1 macro 22 can be configured for 16K storage capacity for 1K words by 36 bits per word and the RAM2 macro 24 can be configured for 8K storage capacity for up to 512 words and 36 bits per word.

We claim:

1. In a computer design system for generating physical design descriptions for VLSI semiconductor circuit devices of the type including a matrix array of dual-row cell locations within a grid of first and second conductive lines extending in first and second orthogonal directions, a method for generating a circuit macro physical design description having a selected storage capacity, said circuit macro including at least one control block and at least one storage block and said control and storage blocks being variably configured in accordance with the selected storage capacity, said method comprising the steps of:

identifying a selected number of words and a selected number of bits per word for the circuit macro;
selecting one of a plurality of predetermined stored bit decoders for use in the circuit macro;
identifying a required number of storage blocks for said selected number of bits per word responsive to said selected bit decoder;
identifying a required number of columns for said selected number of words responsive to said selected bit decoder;
identifying a required number of rows for said control block responsive to said identified number of columns;
sequentially generating a first row of said control block including a first column of a space cell, next successive columns of word selector cells, and a last column of said selected bit decoder;
sequentially generating a second row of said control block including said first column of an empty cell, said next successive columns of word address personalization cells, and said last column of an INPUT/OUTPUT cell;
sequentially generating subsequent rows of said control block responsive to said identified number of rows including said first column of an empty cell, said next successive columns of word address personalization cells, and said last column of an empty cell;
sequentially generating a row for each of said identified number of storage blocks including a first column of a space cell, next successive columns of memory array cells and a last column of an INPUT/OUTPUT cell.

2. A method for generating a circuit macro as claimed in claim 1 wherein said step of selecting one of a plurality of predetermined stored bit decoders for use in the circuit macro includes the steps of:

calculating a resulting area for the circuit macro for each of said plurality of predetermined stored bit decoders;
comparing said calculated areas to identify a minimum area; and
selecting said bit decoder resulting in said identified minimum area.

3. A method for generating a circuit macro as claimed in claim 2 wherein said step of calculating a resulting area for the circuit macro for each of said plurality of predetermined stored bit decoders includes the steps of:

calculating a resulting number of word selectors for the selected number of words;
multiplying said calculated number of word selectors by a predefined value and incrementing said multiplication result by a predetermined number of cells to identify a horizontal dimension in cells;
calculating a resulting number of storage blocks for the selected number of bits per word;
multiplying said calculated number of storage blocks by a corresponding number of cells and incrementing said multiplication result by a predetermined number of cells to identify a vertical dimension in cells; and
multiplying said identified horizontal dimension by said identified vertical dimension to determine the macro cell area.

4. A method for generating a circuit macro as claimed in claim 1 wherein said step of selecting one of a plurality of predetermined stored bit decoders for use in the circuit macro includes the steps of:

identifying at least one performance value for the resulting circuit macro for each of said plurality of predetermined stored bit decoders;
comparing said identified performance values to identify a desired performance value; and
selecting said bit decoder resulting in said desired performance value.

5. A method for generating a circuit macro as claimed in claim 1 wherein said step of identifying a required number of storage blocks for said selected number of bits per word responsive to said selected bit decoder includes the steps of:
- multiplying said selected number of bits per word by said selected bit decoder output number;
- dividing said multiplication result by a predefined number to identify a required number of full storage blocks, said predefined number corresponding to a number of bits for a full storage block;
- identifying a nonzero fractional part of said multiplication result to determine a required partial storage block.

6. A method for generating a circuit macro as claimed in claim 1 wherein said step of identifying a required number of columns for said selected number of words responsive to said selected bit decoder includes the steps:
- dividing said selected number of words by said selected bit decoder output number; and
- incrementing said division result by a predefined integer value.

7. A method for generating a circuit macro as claimed in claim 1 wherein each of said cells includes a first level cell and a corresponding second level cell, said first level cell including a semiconductor substrate level and first metal wiring cell and said corresponding second level cell including a second metal wiring cell.

8. A method for generating a circuit macro as claimed in claim 1 wherein said successive columns of word selector cells are selectively defined by a first and a second word selector cell corresponding to odd and even column position.

9. A method for generating a circuit macro as claimed in claim 1 wherein said successive columns of word address personalization cells are selectively defined by a true and a complementary word address personalization cells corresponding to odd and even column position.

10. A method for generating a circuit macro as claimed in claim 1 wherein said second row last column INPUT/OUTPUT cell is selectively defined by one of a plurality of predetermined stored INPUT/OUTPUT cells responsive to said identified number of columns.

11. A method for generating a circuit macro as claimed in claim 1 further comprising the step of:
- sequentially generating a first row for each of said identified number of storage blocks including a first column through a last column of empty cells.

12. A method for generating a circuit macro as claimed in claim 1 wherein each of said storage blocks is defined by one of a plurality of storage array cell families responsive to said selected bit decoder.

13. A method for generating a circuit macro as claimed in claim 12 further including the step of identifying a required partial storage block, identifying an array size responsive to said identified required partial storage block and defining said required partial storage block by one of said storage array cell families responsive to said identified partial array size.

14. A method for generating a circuit macro as claimed in claim 1 wherein said last column is selectively defined by one of a plurality of predetermined stored INPUT/OUTPUT cells responsive to said selected bit decoder.

15. A method for generating a circuit macro as claimed in claim 1 wherein said successive columns of memory array cells are selectively defined by a first and a second memory array cell corresponding to odd and even column position.

16. A method for generating a circuit macro as claimed in claim 1 further including the said step of:
- identifying a required number of wiring bay rows for interconnecting between adjacent ones of said control blocks and said storage blocks.

17. A method for generating a circuit macro as claimed in claim 16 further including the steps of:
- sequentially generating a first row including a first column of an empty cell, next successive columns of array bay metal cells, and a last column of an array bay metal INPUT/OUTPUT cell; and
- sequentially generating identical subsequent rows responsive to said identified required number of wiring bay rows.

18. A method for generating a circuit macro as claimed in claim 17 wherein said generated required number of wiring bay rows include a second metal wiring cell.

19. In combination in a computer design system for generating physical design description for VLSI semiconductor circuit devices of the type including a matrix array of dual-row cell locations within a grid of first and second conductive lines extending in a first and second orthogonal directions, the improvement in said system comprising:
- means for identifying a selected number of words and a selected number of bits per word for a circuit macro;
- means for selecting one of a plurality of predetermined stored bit decoders for use in the circuit macro;
- means for identifying a required number of storage blocks for said selected number of bits per word responsive to said selected bit decoder;
- means for identifying a required number of columns for said selected number of words responsive to said selected bit decoder;
- means for identifying a required number of rows for said control block responsive to said identified number of columns;
- means for sequentially generating a first row of said control block including a first column of a space cell, next successive columns of word selector cells, and a last column of said selected bit decoder;
- means for sequentially generating a second row of said control block including said first column of an empty cell, said next successive columns of word address personalization cells, and said last column of an INPUT/OUTPUT cell;
- means for sequentially generating required subsequent rows of said control block including said first column of an empty cell, said next successive columns of word address personalization cells, and said last column of an empty cell; and
- means for defining said identified number of storage blocks responsive to said identified number of columns.

20. The system as recited in claim 19 wherein said means for selecting one of a plurality of predetermined stored bit decoders for use in the circuit macro includes:
- means for calculating a resulting area for the circuit macro for each of said plurality of predetermined stored bit decoders;
- means for comparing said calculated areas to identify a minimum area; and
- means for selecting said bit decoder resulting in said identified minimum area.

21. The system as recited in claim 19 wherein said means for selecting one of a plurality of predetermined stored bit decoders for use in the circuit macro includes:

means for identifying at least one performance characteristic for the resulting circuit macro for each of said plurality of predetermined stored bit decoders;

means comparing said identified performance characteristics to identify a desired performance value; and means for selecting said bit decoder resulting in said desired performance value.

22. The system as recited in claim 19 wherein said means for identifying a required number of storage blocks for said selected number of bits per word responsive to said selected bit decoder includes:

means for multiplying said selected number of bits per word by said selected bit decoder output number;

means for dividing said multiplication result by a predefined number to identify a required number of full storage blocks, said predefined number corresponding to a number of bits for a full storage block;

means for identifying a nonzero fractional part of said multiplication result to determine a required partial storage block.

23. The system as recited in claim 19 wherein said means for identifying a required number of columns for said selected number of words responsive to said selected bit decoder includes:

means for dividing said selected number of words by said selected bit decoder output number; and means for incrementing said division result by a predefined integer value.

24. The system as recited in claim 19 wherein said means for defining said identified number of storage blocks responsive to said identified number of columns includes:

means for sequentially generating a first row including a first column through a last column of empty cells;

means for sequentially generating a second row including a first column of a space cell, next successive columns of memory array cells and a last column of an INPUT/OUTPUT cell to define each of said identified number of storage blocks.

25. A VLSI semiconducter chip including a semiconductor substrate adjacent first and second metal layers defining a grid of first and second conductive lines extending in first and second orthogonal directions, and including at least one circuit macro having a selected storage capacity, said chip being characterized by said circuit macro comprising:

an array of circuit blocks, each of said circuit blocks including at least one row of an identified number of columns extending in said first direction, and said respective columns being aligned in said second direction;

said circuit blocks including at least one control block and an identified number of storage blocks;

said control block including a control section for generating timing signals, a word decoder section for decoding word address inputs and providing decoded word address output signals, a bit decoder section for decoding bit address inputs and providing decoded bit address output signals, and a word selector section for generating word line select output signals responsive to said decoded word address output signals;

said storage block including a sense, latch, driver section for sensing and latching READ/WRITE data, a bit selector section for generating bit line select outputs responsive to said decoded bit address input, and a memory cell array section for storing data;

said bit decoder section defined by a selected one of a plurality of predetermined stored bit decoders, each of said predetermined stored bit decoders having a plurality of predetermined locations for connection with a subplurality of bit address inputs and a subplurality of decoded bit address outputs;

said identified number of columns and said identified number of storage blocks being responsive to said selected bit decoder;

said identified number of columns of said control block including a plurality of successive columns of a word selector cell and each of said successive columns including at least one word address personalization cell and a last column of said selected bit decoder and an INPUT/OUTPUT cell; said INPUT/OUTPUT cell including said control section and said word decoder section;

said memory cell array section of said storage blocks being aligned with said successive columns of a word selector cells and an INPUT/OUTPUT cell including said sense, latch, driver section and said bit selector section of said storage blocks being aligned with said last column.

26. A VLSI semiconducter chip as claimed in claim 25 wherein said output signals of said control block are interconnected with said storage blocks by said second conductive lines.

* * * * *